(12) United States Patent
Cypher

(10) Patent No.: US 8,335,961 B2
(45) Date of Patent: Dec. 18, 2012

(54) FACILITATING PROBABILISTIC ERROR DETECTION AND CORRECTION AFTER A MEMORY COMPONENT FAILURE

(75) Inventor: Robert E. Cypher, Saratoga, CA (US)

(73) Assignee: Oracle America, Inc., Redwood Shores, CA (US)

(*) Notice: Subject to any disclaimer, the term of this patent is extended or adjusted under 35 U.S.C. 154(b) by 769 days.

(21) Appl. No.: 12/494,514

(22) Filed: Jun. 30, 2009

(65) Prior Publication Data

US 2010/0332945 A1    Dec. 30, 2010

(51) Int. Cl.
H03M 13/00 (2006.01)
G06F 11/00 (2006.01)

(52) U.S. Cl. .......................... 714/753; 714/804

(58) Field of Classification Search .......... 714/752–753, 714/755, 758, 766, 804, 807, 763–764, 799–801
See application file for complete search history.

(56) References Cited

U.S. PATENT DOCUMENTS

| | | | | |
|---|---|---|---|---|
| 4,453,251 A | * | 6/1984 | Osman | 714/804 |
| 5,537,423 A | * | 7/1996 | Chen | 714/781 |
| 2003/0061558 A1 | * | 3/2003 | Fackenthal et al. | 714/755 |

* cited by examiner

Primary Examiner — Shelly A Chase
(74) Attorney, Agent, or Firm — Park, Vaughan, Fleming & Dowler LLP

(57) ABSTRACT

A system that provides error detection and correction for a memory that has a specific failed memory component accesses a block of data from the memory. Each block of data includes an array of bits logically organized into rows and columns, including a column including row-checkbits, a column including inner checkbits and data bits, and columns containing data bits. Each column is stored in a different memory component and the checkbits are generated from the data bits. Next, the system attempts to correct a column of the block by using the checkbits and the data bits to produce a corrected column. The system then regenerates row-parity bits and the inner checkbits for the block of data, wherein the block includes the corrected column, and compares the regenerated row-parity bits and inner checkbits with existing row-parity bits and inner checkbits. If the comparison indicates that there remains a double-bit error with both erroneous bits in the same row and one in the column associated with the failed component, the system flips the erroneous bits to correct the double-bit error.

20 Claims, 6 Drawing Sheets

FACILITATING PROBABILISTIC ERROR DETECTION AND CORRECTION AFTER A MEMORY COMPONENT FAILURE

RELATED APPLICATION

The subject matter of this application is related to the subject matter in a co-pending non-provisional application by inventors Robert E. Cypher and Bharat K. Daga, filed on the same day as the instant application, entitled "Facilitating Error Detection and Correction After a Memory Component Failure," having Ser. No. 12/494,506, and filing date 30 Jun. 2009.

BACKGROUND

1. Field

The present invention generally relates to error detection and correction mechanisms in computer memories. More specifically, the present invention relates to a technique that facilitates error detection and error correction after a failure of a memory component in a computer system.

2. Related Art

Computer systems routinely employ error-detecting and error-correcting codes to detect and/or correct various data errors which can be caused, for example, by noisy communication channels and unreliable storage media. Some error codes, such as SECDED Hamming codes, can be used to correct single-bit errors and detect double-bit errors. Other codes, which are based on Galois fields, can be used to correct a special class of multi-bit errors caused by a failure of an entire memory component. (For example, see U.S. Pat. No. 7,188,296, entitled "ECC for Component Failures Using Galois Fields," by inventor Robert E. Cypher, filed 30 Oct. 2003, referred to as "the '296 patent.") After a memory component fails, it is desirable to be able to detect and correct additional errors that arise during subsequent computer system operation. The technique described in the '296 patent can correct subsequent single-bit errors. However, this technique cannot be used to detect subsequent double-bit errors. It is also desirable to be able to reduce the number of additional "checkbits" which are used by this technique to provide such error correction and detection.

Hence, what is needed is a method and an apparatus for detecting and correcting errors that arise after a memory component has failed without the shortcomings of existing techniques.

SUMMARY

Some embodiments of the present invention provide a system that can be reconfigured to provide error detection and correction after a failure of a memory component in a memory system. During operation, the system accesses a block of data from the memory system, wherein the memory system is previously determined to have a specific failed memory component. Each block of data in the memory system includes an array of bits logically organized into R rows and C columns, including two checkbit columns containing checkbits, and C−2 data-bit columns containing data bits. Moreover, each column is stored in a different memory component, and the checkbits are generated from the data bits to provide block-level detection and correction for a failed memory component. Next, if the failed memory component contains a data-bit column for the block of data, the system uses checkbits from the two checkbit columns to correct the data-bit column, and then stores the corrected data-bit column. Next, the system generates and stores new checkbits in a functioning memory component, wherein the new checkbits provide single-error-correction and double-error-detection for erroneous bits in the block of data, but do not provide for detection and correction of a failed memory component.

In some embodiments, the new checkbits are generated using an extended Hamming code which provides single-error-correction and double-error-detection for the block of data.

In some embodiments, the two checkbit columns include a row checkbit column and an inner checkbit column. The row checkbit column contains row-parity bits for each of the R rows in the block. In contrast, the inner checkbit column contains inner checkbits which are defined to cover bits in the array in accordance with a set of check vectors, wherein each check vector is associated with a different bit in the array and is an element of a Galois Field $GF(2^R)$. These check vectors are derived from a set of keys which are unique elements of $GF(2^R)$, wherein each key is associated with a different column of the array. The check vector for a row r of a column c is the product in $GF(2^R)$ of the key for the column c and $\alpha^r$, wherein $\alpha$ is a primitive element of $GF(2^R)$.

In some embodiments, determining that the memory component has failed involves: regenerating the row-parity bits and the inner checkbits for the block of data from the data bits in the block of data; comparing the regenerated row-parity bits and inner checkbits with the existing row-parity bits and inner checkbits in the block of data; and determining that the memory component has failed based on the comparison.

In some embodiments, comparing the regenerated row-parity bits and inner checkbits with the existing row-parity bits and inner checkbits involves: computing a row syndrome by exclusive-ORing the regenerated row-parity bits with the existing row-parity bits; computing an inner syndrome by exclusive-ORing the regenerated inner checkbits with the existing inner checkbits. If the row syndrome has multiple ones, which implies that a memory component has failed, the system uses the row syndrome and the inner syndrome to determine a key for a column associated with the failed memory component, and then compares the generated key against the set of keys to identify the failed memory component.

In some embodiments, generating the key for the column associated with the failed memory component involves performing a division operation in $GF(2^R)$ of the inner syndrome by the row syndrome to generate the key for the column associated with the failed memory component.

In some embodiments, determining the key for the column associated with the failed memory component involves: performing multiplication operations in $GF(2^R)$ between the row syndrome and each key in the set of keys, and comparing the inner syndrome against results of the multiplication operations. If the inner syndrome matches a result, the system determines that the key associated with the result is the key for the column associated with the failed memory component.

In some embodiments, correcting the data-bit column involves: attempting to correct the data-bit column by using the checkbits and the data bits in the block to produce a corrected data-bit column; regenerating the row-parity bits and the inner checkbits from the data bits in the array, including data bits from the corrected data-bit column, and comparing the regenerated row-parity bits and inner checkbits with existing row-parity bits and inner checkbits. If the comparison indicates that there remains a double-bit error wherein both erroneous bits are in the same row and one is in the column associated with the failed component, the system flips the erroneous bits to correct the double-bit error.

In some embodiments, attempting to correct the data-bit column to produce a corrected data-bit column involves: using the row syndrome to identify erroneous bits in the data-bit column associated with the failed memory component; and flipping the identified erroneous bits to produce the corrected data-bit column.

In some embodiments, $CV(x, y)$ is the check vector associated with the bit at row x and column y of the array, and wherein the set of keys are selected so that for any two distinct rows $r_1$ and $r_2$ and any three distinct columns $c_1$, $c_2$, and $c_3$, $CV(r_1, c_1)$ XOR $CV(r_2, c_2)$ XOR $CV(r_1, c_3)$ XOR $CV(r_2, c_3)$ is not equal to zero.

In some embodiments, a key associated with a column $c_y$ is denoted as $key(c_y)$, wherein the set of keys are selected so that for any row r, and for any three distinct columns $c_1$, $c_2$ and $c_3$, $key(c_1)$ XOR $key(c_2)$ is not equal to the product in $GF(2^R)$ of $key(c_1)$ XOR $key(c_3)$ and $\alpha^r$.

In some embodiments, a first key in the set of keys associated with the row checkbit column is all zeros; and a second key in the set of keys associated with the inner checkbit column is all zeros except for a one in the least significant position.

In some embodiments, each data block contains a cache line or a portion of a cache line.

Some embodiments of the present invention provide a system that provides error detection and correction after a failure of a memory component in a memory system. During operation, the system accesses a block of data from the memory system, wherein the memory system is previously determined to have a specific failed memory component. Each block of data in the memory system includes an array of bits logically organized into R rows and C columns, including a row checkbit column including row-checkbits for each of the R rows, an inner checkbit column including X<R inner checkbits and R−X data bits, and C−2 data-bit columns containing data bits. Note that each column is stored in a different memory component, and the checkbits are generated from the data bits to provide block-level detection and correction for a failed memory component. Next, the system attempts to correct a column of the block from the failed memory component by using the checkbits and the data bits to produce a corrected column. The system then regenerates the row-parity bits and the inner checkbits for the block of data, wherein the block includes the corrected column, and compares the regenerated row-parity bits and inner checkbits with existing row-parity bits and inner checkbits. If the comparison indicates that there remains a double-bit error wherein both erroneous bits are in the same row and one is in the column associated with the failed component, the system flips the erroneous bits to correct the double-bit error.

In some embodiments, the row checkbit column contains row-parity bits for each of the R rows in the block, and the inner checkbit column contains X<R inner checkbits which are defined to cover bits in the array in accordance with a set of check vectors. Each of these check vectors is associated with a different bit in the array and is an element of a Galois Field ($GF(2^X)$). Moreover, the check vectors are derived from a set of keys which are unique elements of $GF(2^X)$, wherein each key is associated with a different column of the array, and wherein the check vector for a row r of a column c is the product in $GF(2^X)$ of the key for the column c and $\alpha^r$, wherein $\alpha$ is a primitive element of $GF(2^X)$.

In some embodiments, the set of keys are elements of a subfield of $G(2^X)$, wherein the subfield does not contain any $\alpha^i$, where $1 \leq i < R$.

In some embodiments, attempting to correct the column from the failed memory component involves: regenerating the row-parity bits and the inner checkbits for the block of data from the data bits in the block of data; computing a row syndrome by exclusive-ORing the regenerated row-parity bits with the existing row-parity bits; computing an inner syndrome by exclusive-ORing the regenerated inner checkbits with the existing inner checkbits; using the row syndrome to identify erroneous bits in the data-bit column associated with the failed memory component; and flipping the identified erroneous bits to produce the corrected data-bit column.

In some embodiments, prior to accessing the block of data, the system generates the set of keys associated with the columns so that $key_0 = 0$, and for each i, $1 \leq i \leq C-1$, $key_i = \alpha^{((2^{(X/2)}+1)j)}$, wherein j is a unique integer for each value of i and X is an even integer.

DETAILED DESCRIPTION

Figure 1:
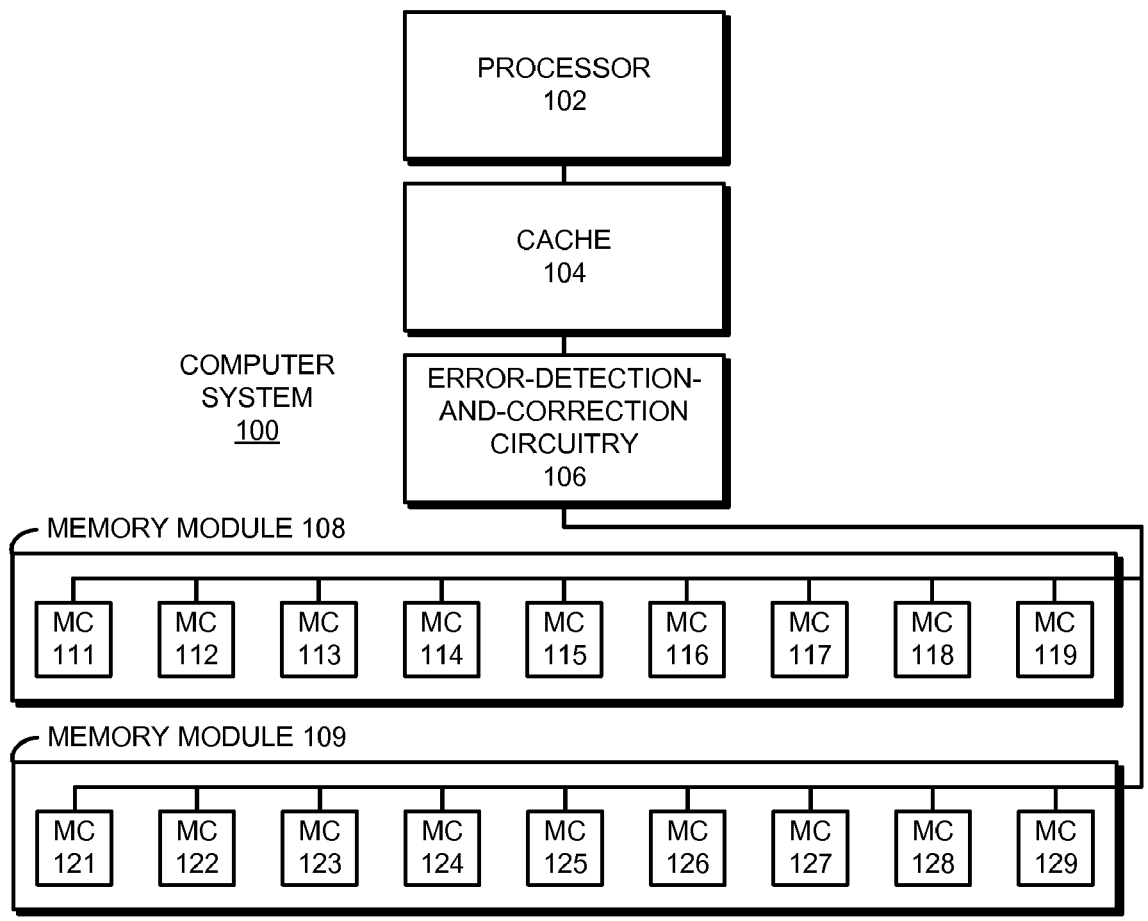
FIG. 1 illustrates a computer system in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

One embodiment of the present invention provides a mechanism for detecting and probabilistically correcting multi-bit errors caused by the failure of a communication or memory component (such as the failure of a DRAM chip) and, in addition, correcting single-bit errors once a failed component has been identified. This embodiment detects all component failures and corrects all single-bit errors. It can also correct component failures with very high probability. Moreover, when it cannot correct a component failure, it is able to determine that it cannot perform the correction (thus, it never causes data corruption due to a failed attempt to correct a component failure). In addition, once a failed component has been identified, it corrects all errors in the given component, plus any single-bit error in any other component.

The ability to correct single-bit errors in addition to the errors in the failed component is advantageous because it facilitates: (1) the correction of latent single-bit errors after a DRAM chip failure occurs; and (2) continued operation with a failed DRAM chip while providing SEC without remapping the data. Finally, the code is very efficient in terms of the number of checkbits required. For example, if 18×8 DRAM chips with a burst length of 4 are used to store a 64 B cache line plus 22 bits of metadata, the code can be used to provide a probability of $(1-1/2^{10})$ of correcting a chip failure. Similarly, if 64 B of data and 12 bits of metadata are being stored, the code will have a probability of $(1-1/2^{20})$ of correcting a chip failure.

In one embodiment of the present invention, the memory system accesses blocks of data (e.g., cache lines). Each of these blocks is logically organized into C sets of R bits each, which are viewed as forming an array with R rows and C columns, such that the bits affected by the failure of a single component are located in a single column. For example, if 576 bits are stored on 18 DRAM chips, with 32 bits per DRAM, the bits can be viewed as forming a 32×18 array, wherein the bits stored on a single DRAM comprise a single column of the array. In this example, the rows are numbered 0 through R−1 and the columns are numbered 0 through C−1.

Column 0 and column 1 include checkbits. More specifically, column 0 contains "row-parity checkbits," wherein the row-parity checkbit stored in position (r, 0) is the even parity of the bits stored in positions (r, c), where $1 \le c \le C-1$. Column 1 contains X inner checkbits and R−X additional data bits. The X inner checkbits are used if component failure correction is desired to be possible with a probability of $1-2^{-X}$.

Associated with each column c, $0 \le c \le C-1$, is a unique key, $key_c$, which is a member of the Galois Field $GF(2^X)$. Moreover, each inner checkbit is the even parity of a subset of the R*C bits in a block. Specifically, the bit in location (r, c) is in the subset of bits covered by inner checkbit i, $0 \le i \le X-1$, iff bit i of $(key_c * \alpha^r)=1$, where the multiplication is in $GF(2^X)$ and $\alpha$ is a primitive element of $GF(2^X)$. Correction of component failure errors can be accomplished whenever the inner syndrome is nonzero by dividing (in $GF(2^X)$) the row syndrome by the inner syndrome to produce $key_c$, where c is the column containing the error. In practice, division in $GF(2^X)$ is difficult to perform in hardware, so it is also possible to simply guess (in parallel) that each column contains the error, calculate the inner syndrome that results from that guess, and check the calculated inner syndrome against the true inner syndrome.

In addition, once a failed component has been identified, SEC (single-error correction) can be performed by first using the above technique to attempt to correct the failed component. At this point, if there was a single-bit error in the original data (in addition to the component error), there is now a double-bit error where both bits in error are in the same row and one is in the column corresponding to the failed component. (Note that this second error is "projected" into the failed component by the attempt to correct the failed component.) Next, the system calculates the inner syndrome of the resulting data and if it is nonzero, corrects these remaining two errors by flipping those bits that yield this unique nonzero inner syndrome (assuming the given failed component).

To enable SEC with an identified failed component $c_f$, $0 \le c_f \le C-1$, it is necessary to guarantee that for each $r_1$, $0 \le r_1 \le R-1$, and $c_1$, $0 \le c_1 \le C-1$, inner_syndrome$(r_1, c_1)$ XOR inner_syndrome$(r_1, c_f)$ is unique (and thus the inner syndrome can be used for SEC). This is accomplished by selecting the keys assigned to the columns such that they are elements of a subfield of $GF(2^X)$. One particular way to do this is to select $key_0=0$ and for each i, $1 \le i \le C-1$, $key_i=\alpha^{((2^{(X/2)}+1)(i-1))}$ assuming X is an even integer. This definition of the keys guarantees that they are members of a subfield of $GF(2^X)$, wherein the subfield does not contain any $\alpha^i$, where $1 \le i < R$, and thus any single-bit error in row 0 and its projection will yield an inner syndrome that is also within the subfield (as a subfield is closed under addition). Similarly, any single-bit error in row $r_1$ and its projection will yield an inner syndrome that is $r_1$ times an element of the subfield containing row 0, and thus is unique.

Note that inner checkbit i, $0 \le i \le X-1$, can be stored in location (i, 1) by selecting $key_1=1$. The selection of unique keys guarantees that all single-bit errors will have a unique syndrome and thus can be corrected. Also, note that by selecting $key_0=0$, the inner checkbits do not cover the row checkbits and thus there is no circularity in their definition.

In the above analysis, it was assumed that the inner syndrome is a random member of $GF(2^X)$. Note that certain small numbers of errors may be guaranteed to produce a nonzero inner syndrome. Also, note that data whitening (in which a pseudo-random pattern, depending only on the memory address, is XORed with the stored data) can be used to increase the randomness of the stored data (and thus of the inner syndrome when an error occurs). Finally, note that once one memory access encounters a multi-bit component failure and determines which component has failed, successive memory accesses can use the known failed component ID to guarantee correction of errors on that component.

The above-described technique is described in more detail below, but first we describe an exemplary computer system.

Computer System

FIG. 1 illustrates a computer system 100 in accordance with an embodiment of the present invention. Computer system 100 can generally include any type of computer system, including, but not limited to, a computer system based on a microprocessor, a mainframe computer, a digital signal processor, a portable computing device, a personal organizer, a cell phone, a device controller, or a computational engine within an appliance. Computer system 100 includes at least one processor 102, a cache memory 104, error-detection-and-correction circuitry 106 and memory modules 108 and 109. Processor 102 can include any type of computational engine that executes code and manipulates data. Cache memory 104 can include one or more caches or levels of caches, which store blocks of data (cache lines) which have recently been accessed or are likely to be accessed in the near future.

Error-detection-and-correction circuitry 106 includes circuitry that performs error correction and error detection operations for blocks of data which are retrieved from memory modules 108-109 and which are stored in cache memory 104. Note that the error-correction and error detection operations can additionally (or alternatively) be performed when blocks of data in cache memory 104 are accessed by processor 102 from cache memory 104. One embodiment of the error-detection-and-correction circuitry 106 is described in U.S. Pat. No. 7,188,296, entitled "ECC for Component Failures Using Galois Fields," by inventor Robert E. Cypher, filed 30 Oct. 2003, which is hereby incorporated by reference to provide details about how to implement such circuitry.

Memory modules 108 and 109 include memory components, which can be semiconductor chips containing random-access memory. More specifically, memory module 108 includes memory components (MCs) 111-119 and memory module 109 includes MCs 121-129.

Handling a Failure by Re-Encoding

Figure 2:
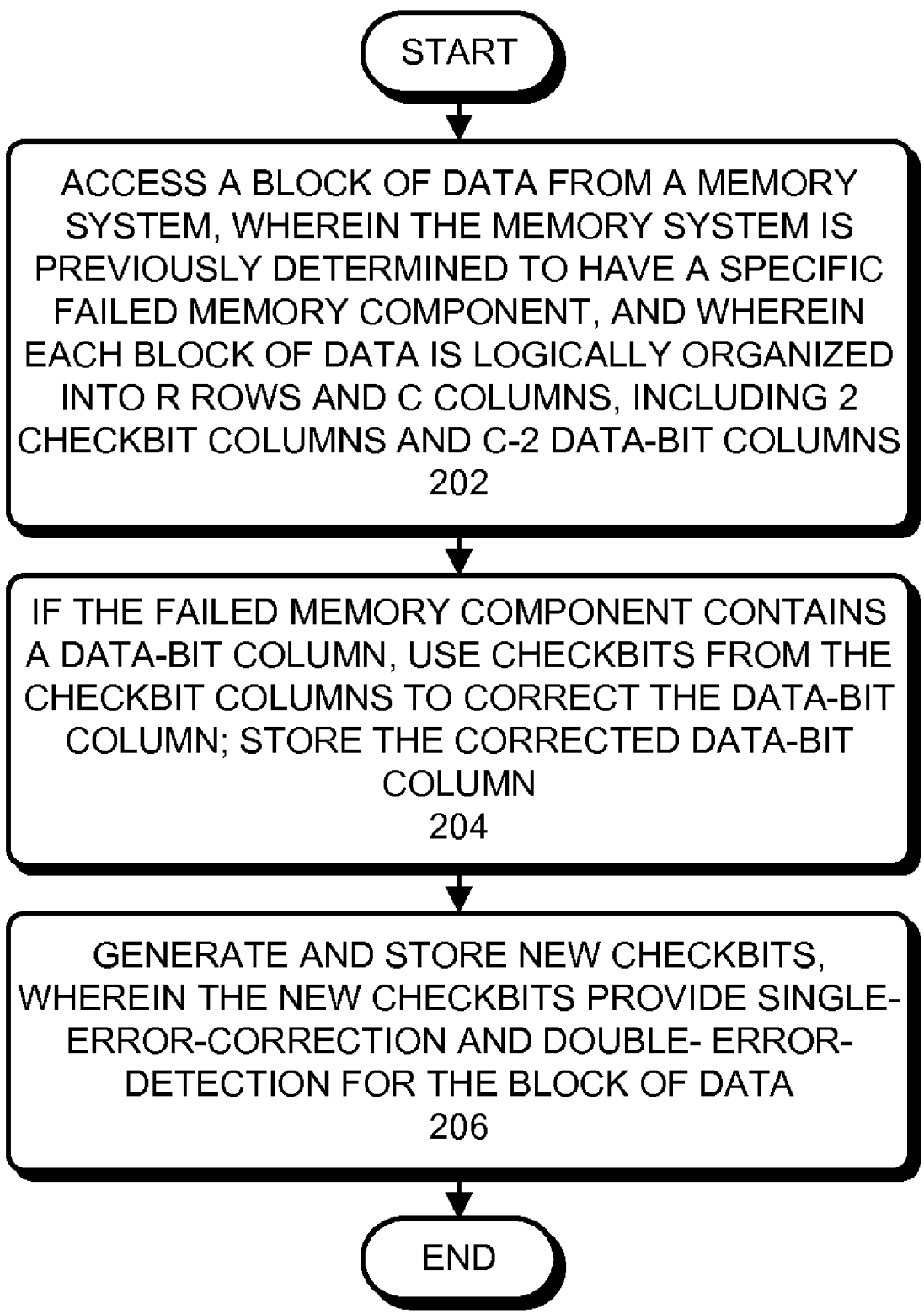
FIG. 2 presents a flow chart illustrating the process of dealing with a failure of a memory component during a memory access in accordance with an embodiment of the present invention.

FIG. 2 presents a flow chart illustrating the process of dealing with a failure of a memory component in accordance with an embodiment of the present invention. During operation, the system accesses a block of data from the memory system, wherein the memory system is previously determined to have a specific failed memory component. Each block of data in the memory system includes an array of bits logically organized into R rows and C columns, including two checkbit columns containing checkbits, and C–2 data-bit columns containing data bits. Moreover, each column is stored in a different memory component, and the checkbits are generated from the data bits to provide block-level detection and correction for a failed memory component (step 202).

Next, if the failed memory component contains a data-bit column for the block of data, the system uses checkbits from the two checkbit columns to correct the data-bit column, and stores the corrected data-bit column (step 204). For example, the new checkbits can be generated using an extended Hamming code which provides single-error-correction and double-error-detection for the block of data.

Next, the system generates and stores new checkbits in a functioning memory component, wherein the new checkbits provide single-error-correction and double-error-detection for erroneous bits in the block of data, but do not provide for detection and correction of a failed memory component (step 206).

Figure 3:
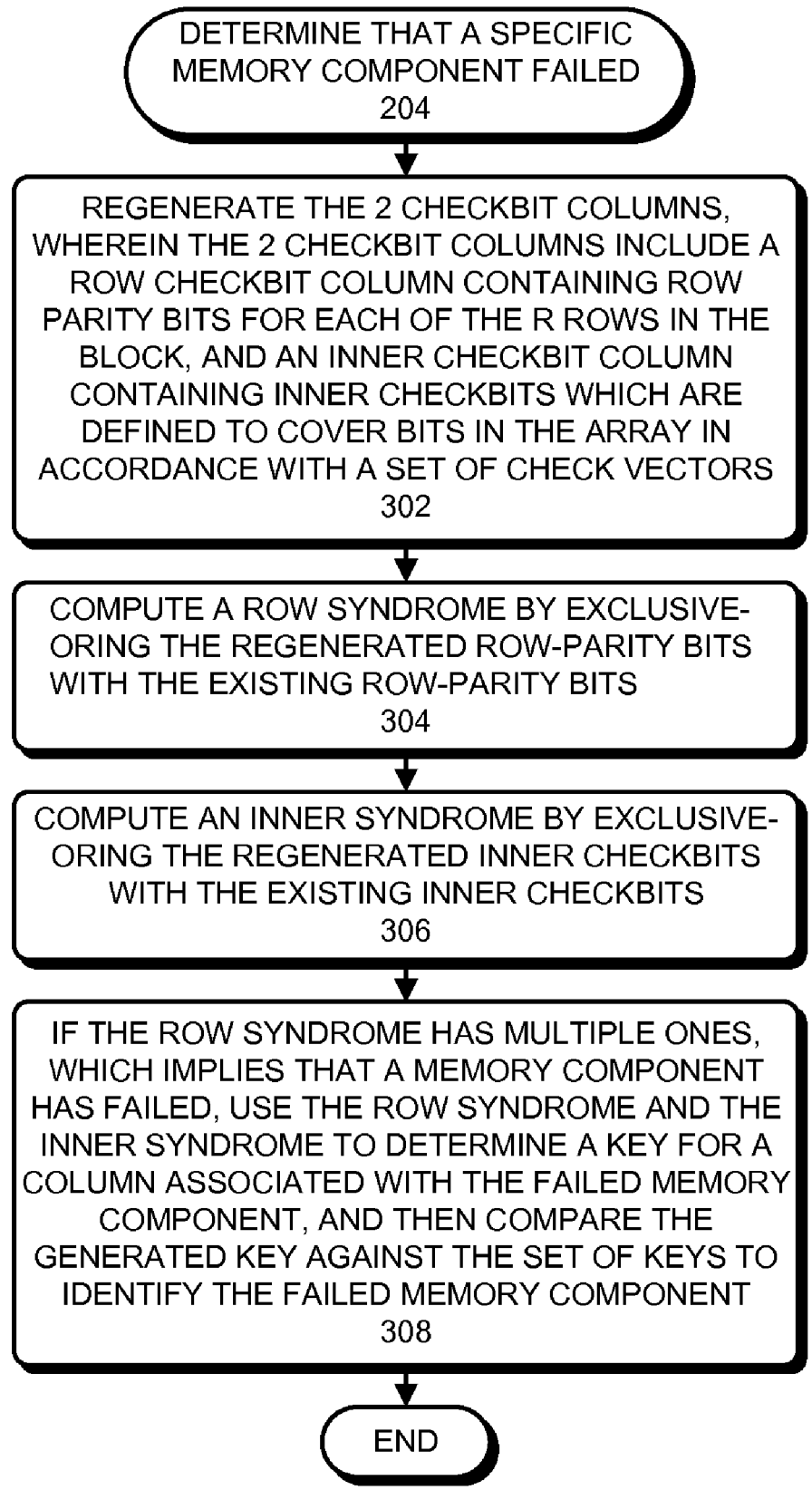
FIG. 3 presents a flow chart illustrating how a failure of a memory component is detected in accordance with an embodiment of the present invention.

FIG. 3 presents a flow chart illustrating how a failure of a memory component is detected in accordance with an embodiment of the present invention. In this embodiment, determining that the memory component has failed involves first regenerating the row-parity bits and the inner checkbits for the block of data from the data bits in the block of data (step 302). Next, the system computes a row syndrome by exclusive-ORing the regenerated row-parity bits with the existing row-parity bits (step 304). The system also computes an inner syndrome by exclusive-ORing the regenerated inner checkbits with the existing inner checkbits (step 306). Next, if the row syndrome has multiple ones, which implies that a memory component has failed, the system uses the row syndrome and the inner syndrome to determine a key for a column associated with the failed memory component, and then compares the generated key against the set of keys to identify the failed memory component (step 308).

Figure 4:
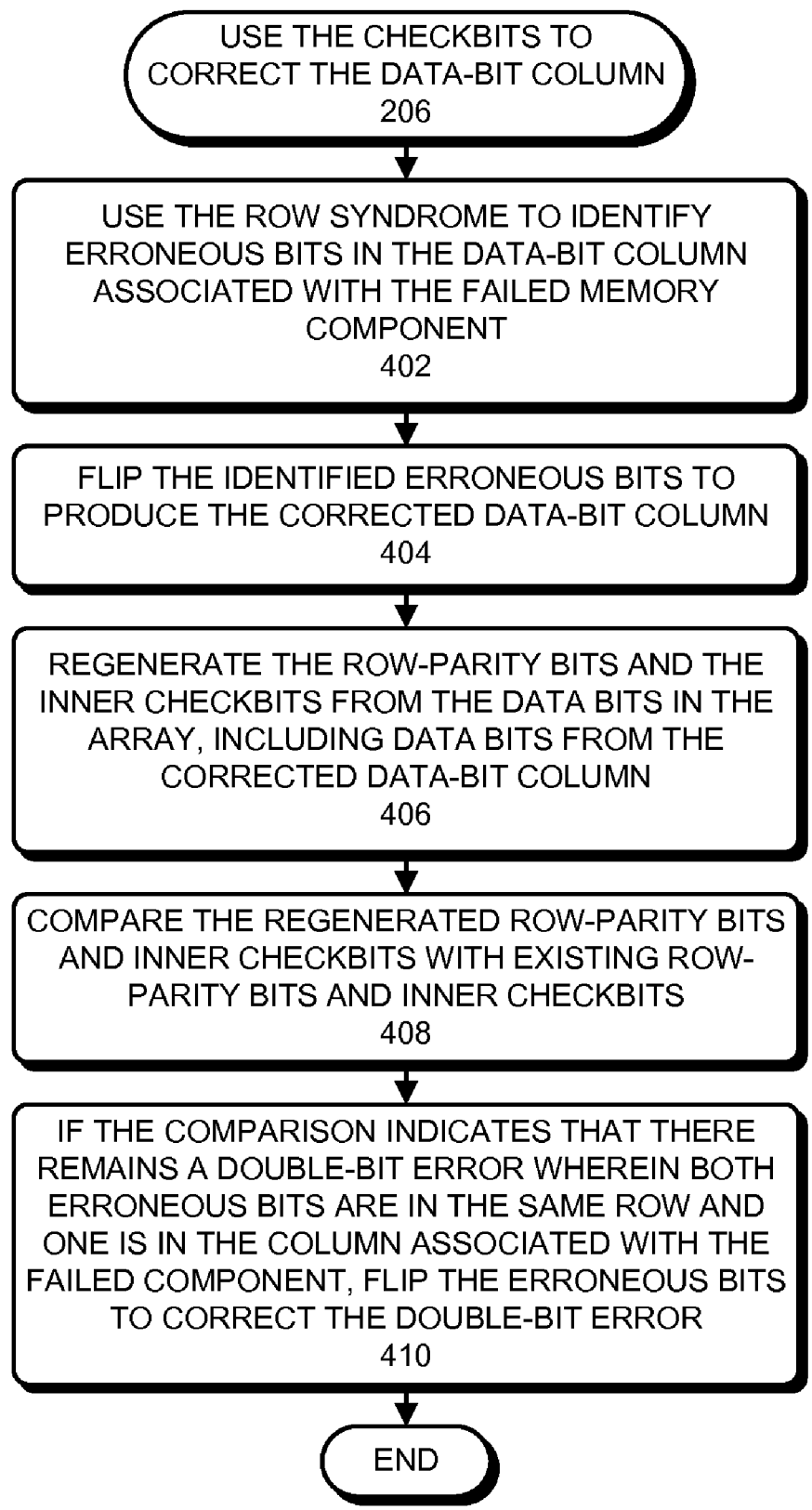
FIG. 4 presents a flow chart illustrating how a data-bit column is corrected in accordance with an embodiment of the present invention.

FIG. 4 presents a flow chart illustrating how a data-bit column is corrected (in step 206 in FIG. 2) in accordance with an embodiment of the present invention. First, the system uses the row syndrome to identify erroneous bits in the data-bit column associated with the failed memory component (step 402). The system then flips the identified erroneous bits to produce the corrected data-bit column (step 404). After the data-bit column is corrected, the system regenerates the row-parity bits and the inner checkbits from the data bits in the array, including data bits from the corrected data-bit column (step 406). Then, the system compares the regenerated row-parity bits and inner checkbits with existing row-parity bits and inner checkbits (step 408). If the comparison indicates that there remains a double-bit error wherein both erroneous bits are in the same row and one is in the column associated with the failed component, the system flips the erroneous bits to correct the double-bit error (step 410). Note that this subsequent detection of a double-bit error can be accomplished by comparing the inner syndrome against a pre-computed set of inner syndromes for all possible double-bit errors of this type.

Handling a Failure Using Fewer Checkbits

Figure 5:
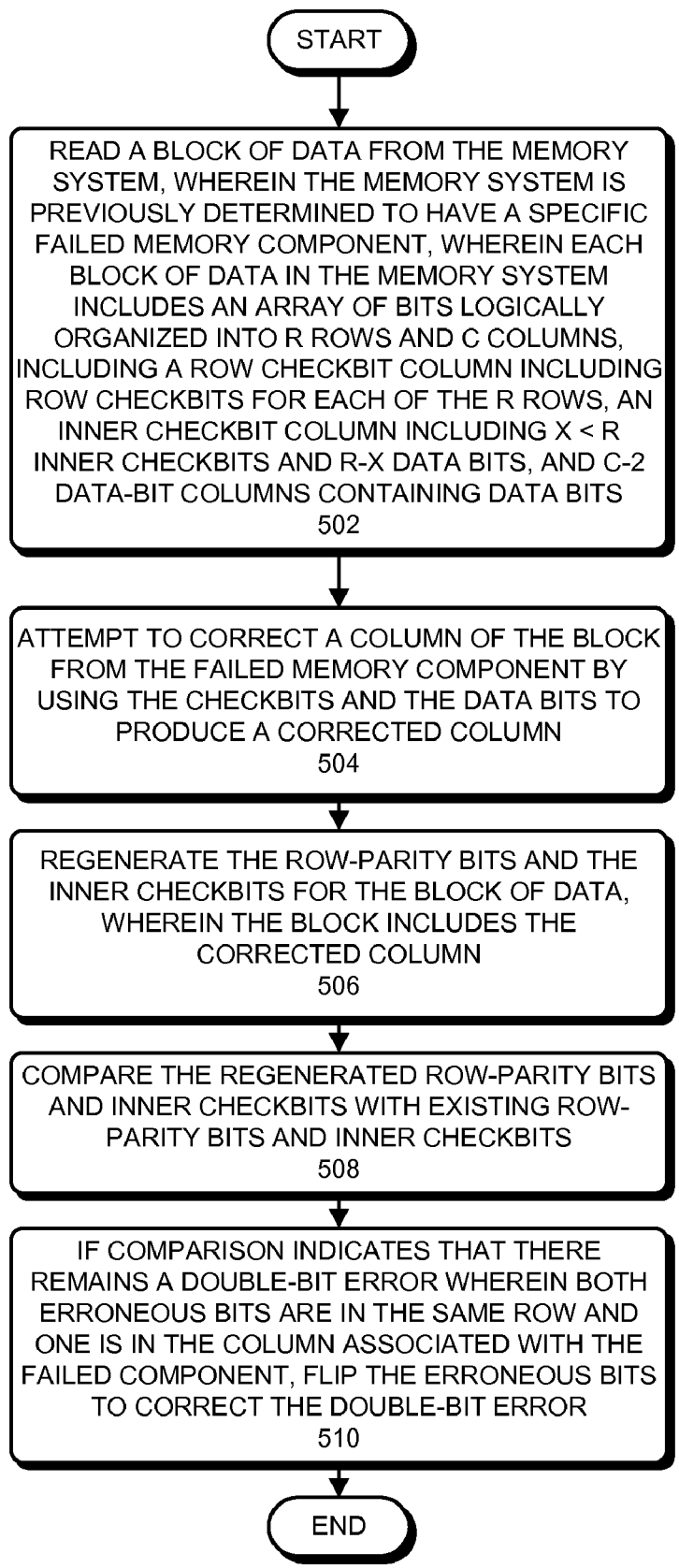
FIG. 5 presents a flow chart illustrating the process of accessing a block of data after a failure in a memory component in accordance with an embodiment of the present invention.

FIG. 5 presents a flow chart illustrating the process of accessing a block of data after a failure in a memory component, wherein the system uses fewer inner checkbits. During this process, the system accesses a block of data from the memory system (step 502). In this example, the memory system is previously determined to have a specific failed memory component, and each block of data in the memory system includes an array of bits logically organized into R rows and C columns, including a row checkbit column including row-checkbits for each of the R rows, an inner checkbit column including X<R inner checkbits and R–X data bits, and C–2 data-bit columns containing data bits (step 502).

Next, the system attempts to correct a column of the block from the failed memory component by using the checkbits and the data bits to produce a corrected column (step 504). The system then regenerates the row-parity bits and the inner checkbits for the block of data, wherein the block includes the corrected column (step 506), and then compares the regenerated row-parity bits and inner checkbits with existing row-parity bits and inner checkbits (step 508). If the comparison indicates that there remains a double-bit error wherein both erroneous bits are in the same row and one is in the column associated with the failed component, the system flips the erroneous bits to correct the double-bit error (step 510). As discussed above, this can be accomplished by comparing the inner syndrome against a pre-computed set of inner syndromes for all possible double-bit errors of this type.

Figure 6:
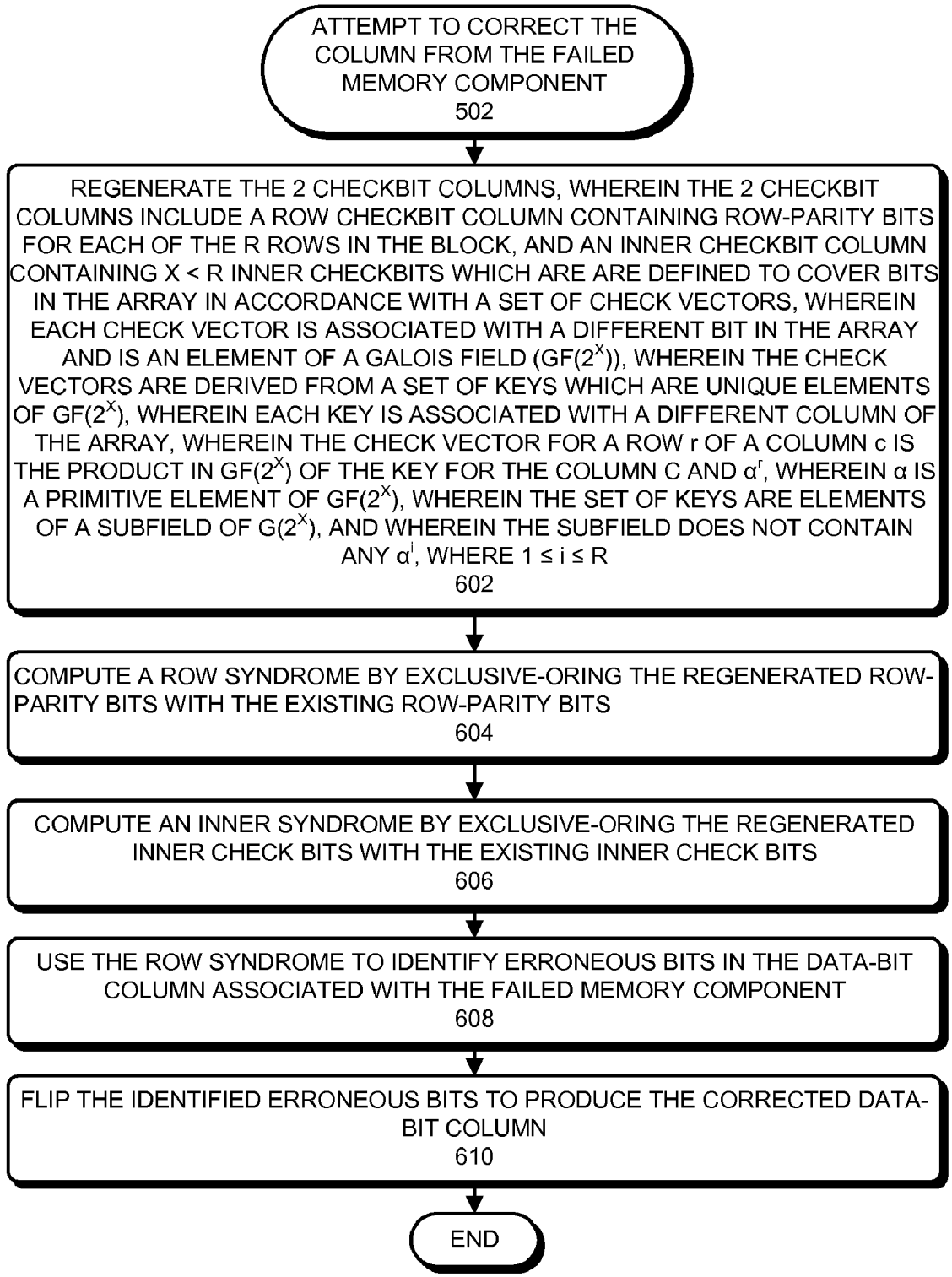
FIG. 6 presents a flow chart illustrating how a column is corrected in accordance with an embodiment of the present invention.

FIG. 6 presents a flow chart illustrating how a column is corrected (in step 502 in FIG. 1) in accordance with an embodiment of the present invention. First, the system regenerates the row-parity bits and the inner checkbits for the block of data from the data bits in the block of data (step 602). Next, the system computes a row syndrome by exclusive-ORing the regenerated row-parity bits with the existing row-parity bits (step 604), and computes an inner syndrome by exclusive-ORing the regenerated inner checkbits with the existing inner checkbits (step 606). Next, the system uses the row syndrome to identify erroneous bits in the data-bit column associated with the failed memory component (step 608). The system then flips the identified erroneous bits to produce the corrected data-bit column (step 610).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for providing error detection and correction after a failure of a memory component in a memory system, comprising:
- accessing a block of data from the memory system, wherein the memory system is previously determined to have a specific failed memory component, wherein each block of data in the memory system includes an array of bits logically organized into R rows and C columns, including a row checkbit column including row-checkbits for each of the R rows, an inner checkbit column including X<R inner checkbits and R–X data bits, and C–2 data-bit columns containing data bits, wherein each column is stored in a different memory component, and wherein the checkbits, which comprise the row-checkbits and the inner checkbits, are generated from the data bits to provide block-level detection and correction for a failed memory component;
- attempting to correct a column of the block from the failed memory component by using the checkbits and the data bits to produce a corrected column;
- regenerating row-parity bits and the inner checkbits for the block of data, wherein the block includes the corrected column;
- comparing the regenerated row-parity bits and inner checkbits with existing row-parity bits and inner checkbits; and
- if comparison indicates that there remains a double-bit error wherein both erroneous bits are in the same row and one is in the column associated with the failed component, flipping the erroneous bits to correct the double-bit error.

2. The method of claim 1,
wherein the row checkbit column contains the row-parity bits for each of the R rows in the block; and
wherein the inner checkbit column contains X<R inner checkbits which are defined to cover bits in the array in accordance with a set of check vectors, wherein each check vector is associated with a different bit in the array and is an element of a Galois Field ($GF(2^X)$), wherein the check vectors are derived from a set of keys which are unique elements of $GF(2^X)$, wherein each key is associated with a different column of the array, and wherein the check vector for a row r of a column c is the product in $GF(2^X)$ of the key for the column c and $\alpha^r$, wherein $\alpha$ is a primitive element of $GF(2^X)$.

3. The method of claim 2, wherein the set of keys are elements of a subfield of $G(2^X)$, wherein the subfield does not contain any $\alpha^i$, where $1 \leq i \leq R$.

4. The method of claim 3, wherein attempting to correct the column from the failed memory component involves:
- regenerating the row-parity bits and the inner checkbits for the block of data from the data bits in the block of data;
- computing a row syndrome by exclusive-ORing the regenerated row-parity bits with the existing row-parity bits;
- computing an inner syndrome by exclusive-ORing the regenerated inner checkbits with the existing inner checkbits;
- using the row syndrome to identify erroneous bits in the data-bit column associated with the failed memory component; and
- flipping the identified erroneous bits to produce the corrected data-bit column.

5. The method of claim 3, wherein for the case where the corrected column was produced and the row-parity bits and the inner checkbits were regenerated using the corrected column, comparing the regenerated row-parity bits and inner checkbits with the existing row-parity bits and inner checkbits involves:
- computing a row syndrome by exclusive-ORing the regenerated row-parity bits with the existing row-parity bits;
- computing an inner syndrome by exclusive-ORing the regenerated inner checkbits with the existing inner checkbits; and
- determining from the row syndrome and the inner syndrome whether there remains a double-bit error wherein both erroneous bits are in the same row and one is in the column associated with the failed component.

6. The method of claim 3, wherein $CV(x, y)$ is the check vector associated with the bit at row x and column y of the array, and wherein the set of keys are selected so that for any two distinct rows $r_1$ and $r_2$ and any three distinct columns $c_1$, $c_2$, and $c_3$, $CV(r_1, c_1)$ XOR $CV(r_2, c_2)$ XOR $CV(r_1, c_3)$ XOR $CV(r_2, c_3)$ is not equal to zero.

7. The method of claim 3, wherein a key associated with a column $c_y$ is denoted as key($c_y$), and wherein the set of keys are selected so that for any row r, and for any three distinct columns $c_1$, $c_2$ and $c_3$, key($c_1$) XOR key($c_2$) is not equal to the product in $GF(2^X)$ of key($c_1$) XOR key($c_3$) and $\alpha^r$.

8. The method of claim 3, wherein prior to accessing the block of data, the method further comprises generating the set of keys associated with the columns so that key$_0$=0, and for each i, $1 \leq i \leq C-1$, key$_i = \alpha^{((2^{(X/2)}+1)j)}$, wherein j is a unique integer for each value of i and X is an even integer.

9. The method of claim 1, wherein previously determining that the memory component failed involves:
- accessing a block of data from the memory system, wherein the block of data includes an array of bits logically organized into R rows and C columns, including two checkbit columns and C–2 data-bit columns;
- re-generating the checkbits for the two checkbit columns from the data bits in the data-bit columns;
- comparing the re-regenerated checkbits with the existing checkbits in the two checkbit columns; and
- determining that the memory component has failed based on the comparison.

10. The method of claim 9, wherein comparing the regenerated row-parity bits and inner checkbits with the existing row-parity bits and inner checkbits involves:
- computing a row syndrome by exclusive-ORing the regenerated row-parity bits with the existing row-parity bits;
- computing an inner syndrome by exclusive-ORing the regenerated inner checkbits with the existing inner checkbits; and
- if the row syndrome viewed as an element of $GF(2^X)$ is non-zero, using the row syndrome and the inner syndrome to determine a key for a column associated with the failed memory component, and then comparing the determined key against the set of keys to identify the failed memory component.

11. The method of claim 10, wherein determining the key for the column associated with the failed memory component involves performing a division operation in $GF(2^X)$ of the inner syndrome by the row syndrome to determine the key for the column associated with the failed memory component.

12. The method of claim 10, wherein determining the key for the column associated with the failed memory component involves:
- performing multiplication operations in $GF(2^X)$ between the row syndrome and each key in the set of keys;

comparing the inner syndrome against results of the multiplication operations; and if the inner syndrome matches a result, determining that the key associated with the result is the key for the column associated with the failed memory component.

13. The method of claim 1, wherein each data block contains a cache line or a portion of a cache line.

14. A memory system that provides error detection and correction after a failure of a memory component in a memory system, comprising:

an access mechanism configured to access a block of data from the memory system, wherein the memory system is previously determined to have a specific failed memory component, wherein each block of data in the memory system includes an array of bits logically organized into R rows and C columns, including a row checkbit column including row-checkbits for each of the R rows, an inner checkbit column including X<R inner checkbits and R−X data bits, and C−2 data-bit columns containing data bits, wherein each column is stored in a different memory component, and wherein the checkbits, which comprise the row-checkbits and the inner checkbits, are generated from the data bits to provide block-level detection and correction for a failed memory component; and an error-handling circuit configured to,
attempt to correct a column of the block from the failed memory component by using the checkbits and the data bits to produce a corrected column,
regenerate row-parity bits and the inner checkbits for the block of data, wherein the block includes the corrected column,
compare the regenerated row-parity bits and inner checkbits with existing row-parity bits and inner checkbits, and
if comparison indicates that there remains a double-bit error wherein both erroneous bits are in the same row and one is in the column associated with the failed component, flip the erroneous bits to correct the double-bit error.

15. The memory system of claim 14,
wherein the row checkbit column contains the row-parity bits for each of the R rows in the block; and
wherein the inner checkbit column contains X<R inner checkbits which are defined to cover bits in the array in accordance with a set of check vectors, wherein each check vector is associated with a different bit in the array and is an element of a Galois Field (GF($2^X$)), wherein the check vectors are derived from a set of keys which are unique elements of GF($2^X$), wherein each key is associated with a different column of the array, and wherein the check vector for a row r of a column c is the product in GF($2^X$) of the key for the column c and $\alpha^r$, wherein $\alpha$ is a primitive element of GF($2^X$).

16. The memory system of claim 15, wherein the set of keys are elements of a subfield of G($2^X$), wherein the subfield does not contain any $\alpha^i$, where $1 \leq i < R$.

17. The memory system of claim 16, wherein while attempting to correct the column from the failed memory component, the error-handling circuit is configured to:
regenerate the row-parity bits and the inner checkbits for the block of data from the data bits in the block of data;
compute a row syndrome by exclusive-ORing the regenerated row-parity bits with the existing row-parity bits;
compute an inner syndrome by exclusive-ORing the regenerated inner checkbits with the existing inner checkbits;
use the row syndrome to identify erroneous bits in the data-bit column associated with the failed memory component; and
flip the identified erroneous bits to produce the corrected data-bit column.

18. The memory system of claim 16, wherein for the case where the corrected column was produced and the row-parity bits and the inner checkbits were regenerated using the corrected column, while comparing the regenerated row-parity bits and inner checkbits with the existing row-parity bits and inner checkbits, the error-handling circuit is configured to:
compute a row syndrome by exclusive-ORing the regenerated row-parity bits with the existing row-parity bits;
compute an inner syndrome by exclusive-ORing the regenerated inner checkbits with the existing inner checkbits; and
determine from the row syndrome and the inner syndrome whether there remains a double-bit error wherein both erroneous bits are in the same row and one is in the column associated with the failed component.

19. The memory system of claim 16, further comprising a key-generation mechanism, wherein prior to accessing the block of data, the key-generation mechanism is configured to generate the set of keys associated with the columns so that $key_0=0$, and for each i, $1 \leq i \leq C-1$, $key_i=\alpha^{((2^{(X/2)}+1)j)}$, wherein j is a unique integer for each value of i and X is an even integer.

20. A computer system that provides error detection and correction after a failure of a memory component in a memory system, comprising:
a processor;
a memory system;
an access mechanism within the memory system configured to access a block of data from the memory system, wherein the memory system is previously determined to have a specific failed memory component, wherein each block of data in the memory system includes an array of bits logically organized into R rows and C columns, including a row checkbit column including row-checkbits for each of the R rows, an inner checkbit column including X<R inner checkbits and R−X data bits, and C−2 data-bit columns containing data bits, wherein each column is stored in a different memory component, and wherein the checkbits, which comprise the row-checkbits and the inner checkbits, are generated from the data bits to provide block-level detection and correction for a failed memory component; and
an error-handling circuit within the memory system configured to,
attempt to correct a column of the block from the failed memory component by using the checkbits and the data bits to produce a corrected column,
regenerate row-parity bits and the inner checkbits for the block of data, wherein the block includes the corrected column,
compare the regenerated row-parity bits and inner checkbits with existing row-parity bits and inner checkbits, and
if comparison indicates that there remains a double-bit error wherein both erroneous bits are in the same row and one is in the column associated with the failed component, flip the erroneous bits to correct the double-bit error.

* * * * *